United States Patent
Pan et al.

(10) Patent No.: US 12,412,738 B1
(45) Date of Patent: Sep. 9, 2025

(54) SYSTEM FOR TARGET ARCING MAPPING AND PLASMA DIAGNOSIS

(71) Applicant: Applied Materials, Inc., Santa Clara, CA (US)

(72) Inventors: Junjie Pan, Sunnyvale, CA (US); Xiangjin Xie, Fremont, CA (US); Fuhong Zhang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/931,664

(22) Filed: Oct. 30, 2024

(51) Int. Cl.
*H01J 37/34* (2006.01)
*C23C 14/35* (2006.01)
*C23C 14/54* (2006.01)

(52) U.S. Cl.
CPC .......... *H01J 37/3476* (2013.01); *C23C 14/35* (2013.01); *C23C 14/54* (2013.01); *H01J 37/3405* (2013.01); *H01J 37/3455* (2013.01)

(58) Field of Classification Search
CPC ...... C23C 14/54; C23C 14/35; H01J 37/3476; H01J 37/3405; H01J 37/3455
USPC ...................................... 204/192.13, 298.03
See application file for complete search history.

(56) References Cited

U.S. PATENT DOCUMENTS

| | | | |
|---|---|---|---|
| 6,179,973 B1 | 1/2001 | Lai et al. | |
| 6,497,796 B1 | 12/2002 | Ashtiani et al. | |
| 7,988,833 B2 * | 8/2011 | Krauss | H01J 37/32935 204/192.12 |
| 8,021,527 B2 | 9/2011 | Miller et al. | |
| 10,312,065 B2 | 6/2019 | Riker et al. | |
| 2002/0088711 A1 | 7/2002 | Lu et al. | |
| 2003/0217914 A1 | 11/2003 | Miller et al. | |
| 2007/0056850 A1 | 3/2007 | Ye et al. | |
| 2008/0083610 A1 | 4/2008 | Tang et al. | |
| 2009/0127101 A1 * | 5/2009 | Nauman | C23C 14/564 204/192.15 |
| 2011/0311735 A1 | 12/2011 | Wang et al. | |
| 2012/0103800 A1 | 5/2012 | Chang et al. | |
| 2012/0111220 A1 | 5/2012 | King et al. | |
| 2012/0181166 A1 | 7/2012 | Luo et al. | |
| 2014/0046475 A1 | 2/2014 | Lam et al. | |

* cited by examiner

*Primary Examiner* — Rodney G McDonald
(74) *Attorney, Agent, or Firm* — Servilla Whitney LLC

(57) ABSTRACT

Methods of monitoring arcing in a process chamber, processing chambers and monitoring apparatus are described. At least one of the angular or radial position of a magnetron is determined in the chamber relative to a reference location on a surface of the substrate using positional information from one or more motors. An arcing profile is generated comprising a plurality of arcing states measured based at least on the determined angular and/or radial position of the magnetron.

20 Claims, 6 Drawing Sheets

US 12,412,738 B1

SYSTEM FOR TARGET ARCING MAPPING AND PLASMA DIAGNOSIS

TECHNICAL FIELD

Embodiments of the disclosure are directed to apparatus and methods for mapping target arcing. In particular, embodiments of the disclosure are directed to apparatus and methods for mapping target arcing in physical vapor deposition (PVD) processing chambers.

BACKGROUND

Reliably producing submicron and smaller features is one of the challenges for the next generation of very large-scale integration (VLSI) and ultra large scale integration (ULSI) of semiconductor devices. However, as the miniaturization of circuit technology continues, the shrinking dimensions of interconnects in VLSI and ULSI technology have placed additional demands on the processing capabilities. For example, as circuit densities increase for next generation devices, the widths of interconnects, such as vias, trenches, contacts, gate structures and other features, as well as the dielectric materials therebetween, decrease while the thickness of the dielectric layers remains substantially constant, with the result of increasing the aspect ratios of the features.

Sputtering, also known in one application as physical vapor deposition (PVD), is a method of forming metallic features in integrated circuits. In such applications, sputtering deposits a material layer on a substrate. A source material, such as a target, is bombarded by ions strongly accelerated by an electric field. The bombardment ejects material from the target, and the material then deposits on the substrate. In other applications, however, sputtering may also be used to etch a substrate.

During deposition and etching using a magnetron assembly, arcing from the target to the substrate or chamber components can occur. Arcing can result in substrate damage and film deposition non-uniformity. In addition, other factors, such as process conditions or process chamber design, can also undesirably affect processing uniformity on the substrate. Determining the source of arcing can be difficult as the location within the chamber of any particular arc is not known. Troubleshooting and repair requires opening the process chamber which can be a time-consuming and expensive process.

Accordingly, there is a need in the art for apparatus and methods to measure arc locations within a process chamber.

SUMMARY

One or more embodiments of the disclosure are directed to a method of monitoring arcing in a process chamber. The method includes: determining at least an angular position of a magnetron in the process chamber relative to a reference location on a surface of the substrate using positional information of a motor used to position the magnetron; and generating an arcing profile including a plurality of arcing states measured based at least on the determined angular position of the magnetron.

Additional embodiments of the disclosure are directed to an apparatus for monitoring arcing within a process chamber including a moveable magnetron and at least one power supply. The apparatus includes: a processor; and a memory coupled to the processor. The memory has stored therein instructions executable by the processor to configure the apparatus to: determine at least an angular position of a magnetron in the process chamber relative to a reference location on a surface of the substrate using positional information of a motor used to position the magnetron; and generate an arcing profile including a plurality of arcing states measured based at least on the determined angular position of the magnetron.

Further embodiments of the disclosure are directed to a substrate processing system including: a process chamber having an inner volume; a substrate support disposed within the inner volume to support a substrate; a target having a front face exposed to the inner volume; a movable magnetron disposed proximate a back side of the target opposite the front face and rotatable about a central axis of the substrate support; and at least one power supply providing power to the process chamber; and a controller including a processor and a memory coupled to the processor, the memory having stored therein instructions executable by the processor to configure the controller to: determine at least an angular position of a magnetron in the process chamber relative to a reference location on a surface of the substrate using positional information of a motor used to position the magnetron; and generate an arcing profile including a plurality of arcing states measured based at least on the determined angular position of the magnetron.

BRIEF DESCRIPTION OF THE DRAWINGS

So that the manner in which the above recited features of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
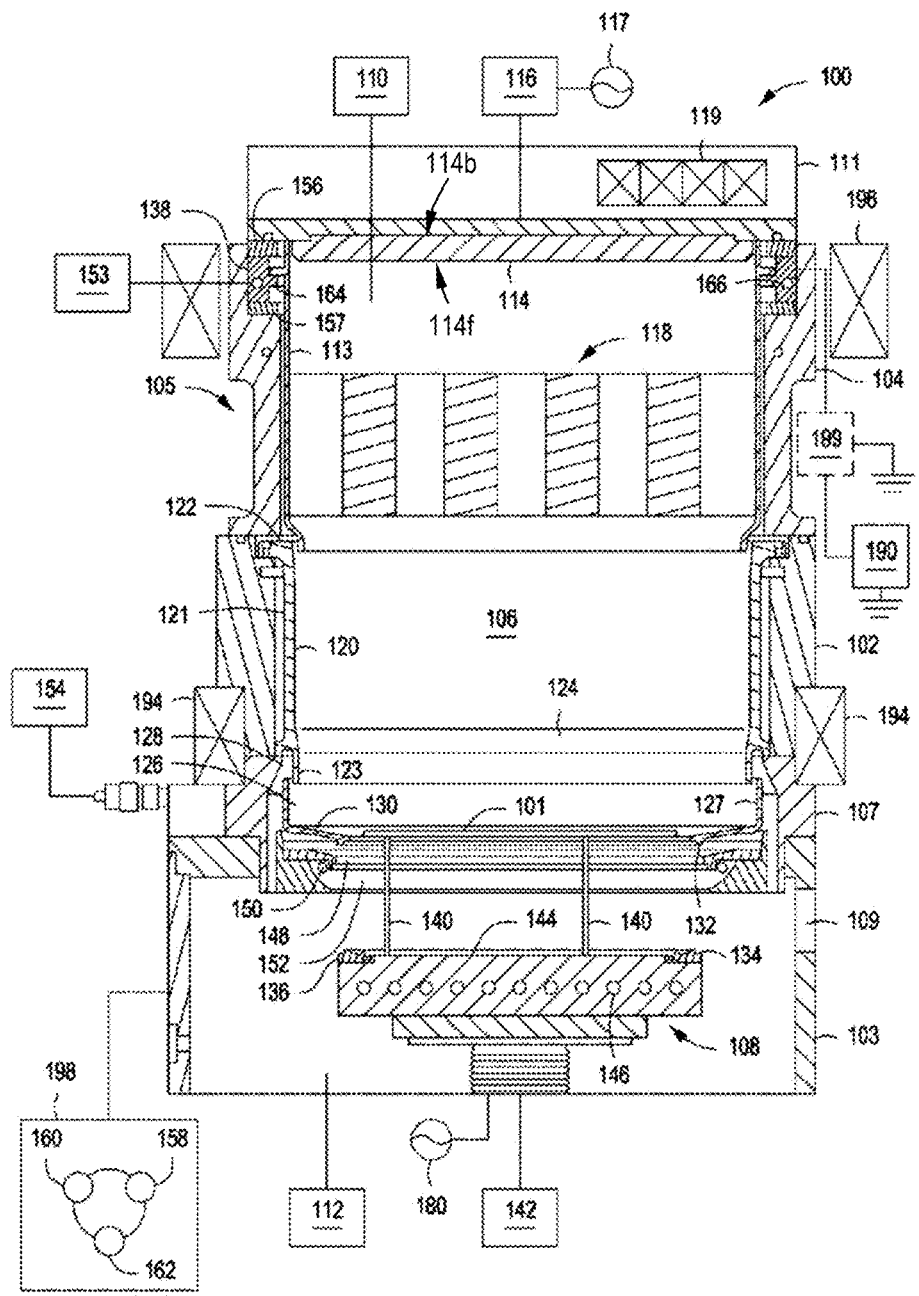
FIG. 1 illustrates a schematic cross-sectional view of a physical vapor deposition (PVD) chamber in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" or "wafer" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

The term "about" as used herein means approximately or nearly and in the context of a numerical value or range set forth means a variation of ±15% or less, of the numerical value. For example, a value differing by ±14%, ±10%, ±5%, ±2%, ±1%, ±0.5%, or ±0.1% would satisfy the definition of "about."

Spatially relative terms, such as "beneath," "below," "lower," "above," "upper" and the like, may be used herein for ease of description to describe one element or feature's relationship to another element(s) or feature(s) as illustrated in the Figures. It will be understood that the spatially relative terms are intended to encompass different orientations of a device in use or operation in addition to the orientation depicted in the figures. For example, if the device in the Figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

One or more embodiments of the disclosure relate to a high resolution control system that enables process monitoring based on an angular and/or a radial position of a magnetron in real time. For example, the magnetron position and/or angle and/or the radial position of the magnet may be used as a parameter in monitoring plasma arcing which can damage a wafer during processing, adding a new diagnostic and monitoring ability to a process chamber.

Some embodiments of the disclosure advantageously allow for the plasma monitoring of a process chamber to determine arc occurrences. Some embodiments allow for the positional determination of arcing for diagnostics and repairs. In some embodiments, the arc state of a plasma is monitored at a time scale sufficiently low to allow for real-time monitoring. In some embodiments, the plasma monitoring of the process chamber allows for monitoring other sensor readings dynamically, including, but not limited to, target voltages, target current, collimator current, wafer bias, etc. In some embodiments, the sensor readings can be synchronized with the magnetron position (plasma location) and diagnose potential geometrical abnormalities of the plasma.

FIG. 1 depicts an illustrative PVD chamber (process chamber 100), e.g., a sputter process chamber, suitable for sputter depositing materials on a substrate in accordance with embodiments of the present disclosure. The skilled artisan will recognize that other process chambers that use a magnetron can also be employed and that the disclosure is not limited to PVD chambers.

The process chamber 100 has an upper sidewall 102, a lower sidewall 103, a ground adapter 104, and a lid assembly 111 defining a body 105 that encloses an interior volume 106 thereof. An adapter plate 107 may be disposed between the upper sidewall 102 and the lower sidewall 103. A substrate support, such as a pedestal 108, is disposed in the interior volume 106 of the process chamber 100. A substrate transfer port 109 is formed in the lower sidewall 103 for transferring substrates into and out of the interior volume 106.

In some embodiments, the process chamber 100 is configured to deposit, for example, titanium, aluminum oxide, aluminum, aluminum oxynitride, copper, tantalum, tantalum nitride, tantalum oxynitride, titanium oxynitride, tungsten, tungsten nitride, or other materials, on a substrate, such as the substrate 101.

A gas source 110 is coupled to the process chamber 100 to supply process gases into the interior volume 106. In some embodiments, process gases may include inert gases, non-reactive gases, and reactive gases, if necessary. Examples of process gases that may be provided by the gas source 110 include, but not limited to, argon gas (Ar), helium (He), neon gas (Ne), nitrogen gas (N2), oxygen gas (O2), and water (H2O) vapor among others.

A pump 112 is coupled to the process chamber 100 in communication with the interior volume 106 to control the pressure of the interior volume 106 to any suitable pressure for a given process. In some embodiments, during deposition the pressure level of the process chamber 100 may be maintained at about 1 Torr or less. In some embodiments, the pressure level of the process chamber 100 may be maintained at about 500 mTorr or less during deposition. In some embodiments, the pressure level of the process chamber 100 may be maintained at about 1 mTorr and about 300 mTorr during deposition.

The ground adapter 104 may support a target 114 (also referred to as a sputtering source). The target 114 has a front surface 114f exposed to the interior volume 106. The target 114 comprises a suitable material to be sputter deposited on a substrate. In some embodiments, the target 114 may be fabricated from titanium (Ti) metal, tantalum metal (Ta), tungsten (W) metal, cobalt (Co), nickel (Ni), copper (Cu), aluminum (Al), alloys thereof, combinations thereof, or the like.

The target 114 may be coupled to a source assembly 116 comprising a power supply 117 for the target 114. In some embodiments, the power supply 117 may be an RF power supply. In some embodiments, the power supply 117 may alternatively be a DC power supply. In some embodiments, the power supply 117 may include both DC and RF power sources.

A magnetron assembly (magnetron 119) which includes set of rotatable magnets may be coupled adjacent to the target 114 which enhances efficient sputtering materials from the target 114 during processing. The magnetron 119 is also referred to as a movable magnetron and is disposed proximate the back surface 114b of the target 114, opposite the front surface 114f of the target 114. Examples of the magnetron assembly include an electromagnetic linear magnetron, a serpentine magnetron, a spiral magnetron, a double-digitated magnetron, a rectangularized spiral magnetron, among others. The magnetron assembly includes at least one motor for controlling the rotation of the magnets. In some embodiments, two motors are provided for controlling the rotation of the magnets. Rotary encoders, position sensors, or the like may be used to provide a signal representative of the angular position of the magnetron 119. The radial position of the magnetron 119 may be calculated from the angular position or may be determined using one or more encoders, position sensors, or the like.

In some embodiments, a first set of magnets 194 may be disposed between the adapter plate 107 and the upper sidewall 102 to assist generating a magnetic field to guide the metallic ions dislodged from the target 114. A second set of magnets 196 may be disposed adjacent to the ground adapter 104 to assist generating the magnetic field to guide dislodged materials from the target 114. The numbers of the magnets disposed around the process chamber 100 may be selected to control plasma dissociation and sputtering efficiency. The first and second sets of magnets 194, 196 may be electromagnets coupled to a power source for controlling the magnitude of the magnetic field generated by the electromagnets.

An RF power source 180 may be coupled to the process chamber 100 through the pedestal 108 to provide a bias power between the target 114 and the pedestal 108. In some embodiments, the RF power source 180 may have a frequency between about 400 Hz and about 60 MHz, such as about 13.56 MHz.

The process chamber 100 further includes an upper shield 113 and a lower shield 120. A collimator 118 is positioned in the interior volume 106 between the target 114 and the pedestal 108. The collimator 118 includes a plurality of apertures to direct gas and/or material flux within the interior volume 106. The collimator 118 is coupled to the upper shield 113 using any fixation means. In some embodiments, the collimator 118 may be formed integrally with the upper shield 113. The collimator 118 may be electrically biased to control ion flux to the substrate and neutral angular distribution at the substrate, as well as to increase the deposition rate due to the added DC bias. Electrically biasing the collimator results in reduced ion loss to the collimator to advantageously enable greater ion/neutral ratios at the substrate. Optionally, a switch 199 may be disposed between the upper shield 113 and the collimator power source 190 to selectively couple the upper shield 113 and collimator 118 to the collimator power source 190.

In some embodiments, the collimator 118 may be electrically biased in bipolar mode so as to control the direction of the ions passing through the collimator 118. For example, a controllable direct current (DC) or AC collimator power source 190 may be coupled to the collimator 118 to provide an alternating pulsed positive or negative voltage to the collimator 118 so as to bias the collimator 118. In some embodiments, the collimator power source 190 is a DC power source.

To facilitate applying bias to the collimator 118, the collimator 118 is electrically isolated from grounded chamber components such as the ground adapter 104. For example, in the embodiment depicted in FIG. 1, the collimator 118 is coupled to the upper shield 113, which in turn is coupled to the process tool adapter 138. The process tool adapter 138 may be made from suitable conductive materials compatible with processing conditions in the process chamber 100. An insulator ring 156 and an insulator ring 157 are disposed on either side of the process tool adapter 138 to electrically isolate the process tool adapter 138 from the ground adapter 104. The insulator rings 156, 157 may be made from suitable process compatible dielectric materials.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113. In some embodiments, the mounting ring or shelf 164 is a continuous ring about the inner diameter of the process tool adapter 138 to facilitate more uniform thermal contact with the upper shield 113 mounted to the process tool adapter 138.

In some embodiments, a coolant channel 166 may be provided in the process tool adapter 138 to facilitate flowing a coolant through the process tool adapter 138 to remove heat generated during processing. For example, the coolant channel 166 may be coupled to a coolant source 153 to provide a suitable coolant, such as water. The coolant channel 166 advantageously removes heat from the process tool (e.g., collimator 118) that is not readily transferred to other cooled chamber components, such as the ground adapter 104. For example, the insulator rings 156, 157 disposed between the process tool adapter 138 and the ground adapter 104 are typically made from materials with poor thermal conductivity. Thus, the insulator rings 156, 157 reduce the rate of heat transfer from the collimator 118 to the ground adapter 104 and the process tool adapter 138 advantageously maintains or increases the rate of cooling of the collimator 118. In addition to the coolant channel 166 provided in the process tool adapter 138, the ground adapter 104 may also include a coolant channel to further facilitate removing heat generated during processing.

A radially inwardly extending ledge (e.g., the mounting ring, or shelf 164) is provided to support the upper shield 113 within the central opening within the interior volume 106 of the process chamber 100. In some embodiments the shelf 164 is disposed in a location proximate the coolant channel 166 to facilitate maximizing the heat transfer from the collimator 118 to the coolant flowing in the coolant channel 166 during use.

In some embodiments, the lower shield 120 may be provided in proximity to the collimator 118 and interior of the ground adapter 104 or the upper sidewall 102. The lower shield 120 may include a tubular body 121 having a radially outwardly extending flange 122 disposed in an upper surface of the tubular body 121. The flange 122 provides a mating interface with an upper surface of the upper sidewall 102. In some embodiments, the tubular body 121 of the lower shield 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123.

A shield ring 126 may be disposed in the process chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107.

In some embodiments, the shield ring 126 may include an axially projecting annular sidewall 127 that has an inner diameter that is greater than an outer diameter of the shoulder region 123 of the lower shield 120. A radial flange 130 extends from the annular sidewall 127. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the pedestal 108. The recess 134 may be a circular groove formed in the edge ring 136. The engagement of the protrusion 132 and the recess 134 centers the shield ring 126 with respect to the longitudinal axis of the pedestal 108.

The substrate 101 (shown supported on lift pins 140) is centered relative to the longitudinal axis of the pedestal 108 by coordinated positioning calibration between the pedestal 108 and a robot blade (not shown). Thus, the substrate 101 may be centered within the process chamber 100 and the shield ring 126 may be centered radially about the substrate 101 during processing.

In operation, a robot blade (not shown) having the substrate 101 (also referred to as a wafer) disposed thereon is extended through the substrate transfer port 109. The pedestal 108 may be lowered to allow the substrate 101 to be transferred to the lift pins 140 extending from the pedestal 108. Lifting and lowering of the pedestal 108 and/or the lift pins 140 may be controlled by a drive 142 coupled to the pedestal 108. The substrate 101 may be lowered onto a substrate receiving surface 144 of the pedestal 108. With the substrate 101 positioned on the substrate receiving surface 144 of the pedestal 108, sputter deposition may be performed on the substrate 101. The edge ring 136 may be electrically insulated from the substrate 101 during processing. Therefore, the substrate receiving surface 144 may have a height that is greater than a height of portions of the edge ring 136 adjacent the substrate 101 such that the substrate 101 is prevented from contacting the edge ring 136. During sputter deposition, the temperature of the substrate 101 may be controlled by utilizing thermal control channels 146 disposed in the pedestal 108.

In some processes, after sputter deposition, the substrate 101 may be elevated utilizing the lift pins 140 to a position that is spaced away from the pedestal 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon. In some embodiments, reflective surfaces on the chamber components surrounding the substrate 101 serve to focus the energy towards the backside of the substrate 101 and away from other chamber components where the energy would be lost and/or not utilized. The adapter plate 107 may be coupled to the coolant source 153 or 154 to control the temperature of the adapter plate 107 during heating.

After controlling the substrate 101 to a predetermined temperature, the substrate 101 is lowered to a position on the substrate receiving surface 144 of the pedestal 108. The substrate 101 may be rapidly cooled utilizing the thermal control channels 146 in the pedestal 108 via conduction. The temperature of the substrate 101 may be ramped down from the first temperature to a second temperature in a matter of seconds to about a minute. The substrate 101 may be removed from the process chamber 100 through the substrate transfer port 109 for further processing. The substrate 101 may be maintained at a predetermined temperature range, such as less than 250 degrees Celsius.

A controller 198 is coupled to the process chamber 100. The controller 198 includes a central processing unit (CPU) 160, a memory 158, and support circuits 162. The controller 198 is utilized to control the process sequence, regulating the gas flows from the gas source 110 into the process chamber 100 and controlling ion bombardment of the target 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 198 that controls the process chamber 100 such that the processes, including the processes disclosed below, are performed in accordance with embodiments of the present disclosure. The software routines may also be stored and/or executed by a second controller (not shown) that is located remotely from the process chamber 100.

In some embodiments, the process chamber 100 is wired for 4 msec or less network latency for digital communications to facilitate control of the process in substantially real time. As used herein, "real time" means less than 50 msec, 40 msec, 30 msec, 20 msec, 10 msec, 5 msec, 2 msec, 1 msec or less.

During processing, material is sputtered from the target 114 and deposited on the surface of the substrate 101. The target 114 and the pedestal 108 are biased relative to each other by the power supply 117 or the RF power source 180 to maintain a plasma formed from the process gases supplied by the gas source 110. The DC power applied to the collimator 118 also assists with constant or pulsed power, controlling ratio of the ions and neutrals passing through the collimator 118, advantageously enhancing the trench sidewall and bottom fill-up capability. The ions from the plasma are accelerated toward and strike the target 114, causing target material to be dislodged from the target 114. The dislodged target material, and in some embodiments one or more elements from the process gases, forms a layer on the substrate 101.

In operation and with reference to FIG. 1, the magnetron 119 is positioned behind the target 114 to enhance the dislodging of target material in an area of the target 114 proximate the magnetron 119. The inventors determined that the positional information of the magnetron 119 may be used to control a deposition or etching process to, for example, correct for uniformity errors in accordance with the principles described herein.

The process chamber 100 of FIG. 1 is an illustrative example of a process chamber and is not limiting of the scope of the disclosure. In some embodiments in accordance with the present principles, a process chamber can include only some of the components of the process chamber 100 of FIG. 1. For example, in the process chamber 100 of FIG. 1, the lamps 150, the reflector rings 148 and the collimator 118 can be considered optional components for some processes performed in the process chamber 100 of FIG. 1 to which embodiments in accordance with the present principles may be applied. In addition, although the process chamber 100 of FIG. 1 is depicted as a PVD chamber to be used for a material deposition process, in some embodiments, the inventive processes described herein can be applied to a sputter etching process in which the substrate to be etched may be considered the 'target'.

Figure 2:
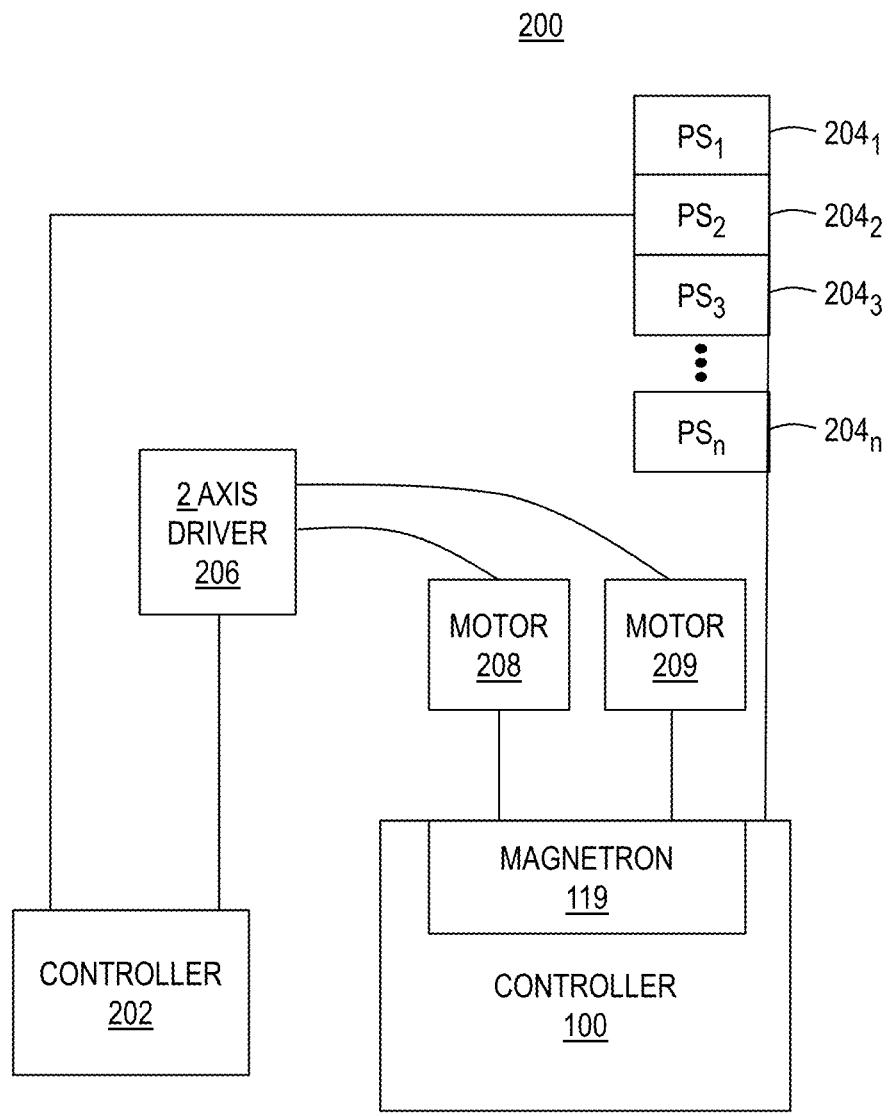
FIG. 2 illustrates a high level block diagram of a system for controlling process uniformity on a substrate within a process chamber in accordance with one or more embodiments of the disclosure.

FIG. 2 depicts a high level block diagram of a system 200 for controlling process uniformity on a substrate within, for example a physical vapor deposition (PVD) chamber or an etching chamber, in accordance with an embodiment of the disclosure. The system 200 of FIG. 2 illustratively comprises a controller 202 and a process chamber, such as the PVD process chamber 100 of FIG. 1 or, alternatively, an etching chamber (not shown). In various embodiments in accordance with the present principles, the controller 202 of FIG. 2 can comprise the controller 198 of FIG. 1 or, in alternate embodiments, the controller 202 can be a second controller as described above with reference to controller 198 of FIG. 1. FIG. 2 further illustratively depicts a representation of the power supplies $204_1$-$204n$, collectively power supplies 204, associated with the various components of the process chamber 100. Such power supplies can include DC or RF source power supply (e.g., power supply 117), RF bias power supply (e.g., RF power source 180), AC or DC shield bias voltage supply (e.g., collimator power source 190), electromagnetic coil current supply (e.g., current supplied to first and/or second magnets 194, 196), or any other power supplies affecting substrate processing.

The system 200 of FIG. 2 further illustratively includes a two-axis driver 206 for controlling respective motors 208, 209 used to position the magnetron 119 of the process chamber 100. In FIG. 2, the power supplies 204, the two-axis driver 206 and the respective motors 208, 209 are depicted as components separate from the process chamber 100, however, in alternate embodiments in accordance with the present principles, the power supplies 204, the two-axis driver 206 and the respective motors 208, 209 may comprise integrated components of the process chamber 100.

Figure 3:
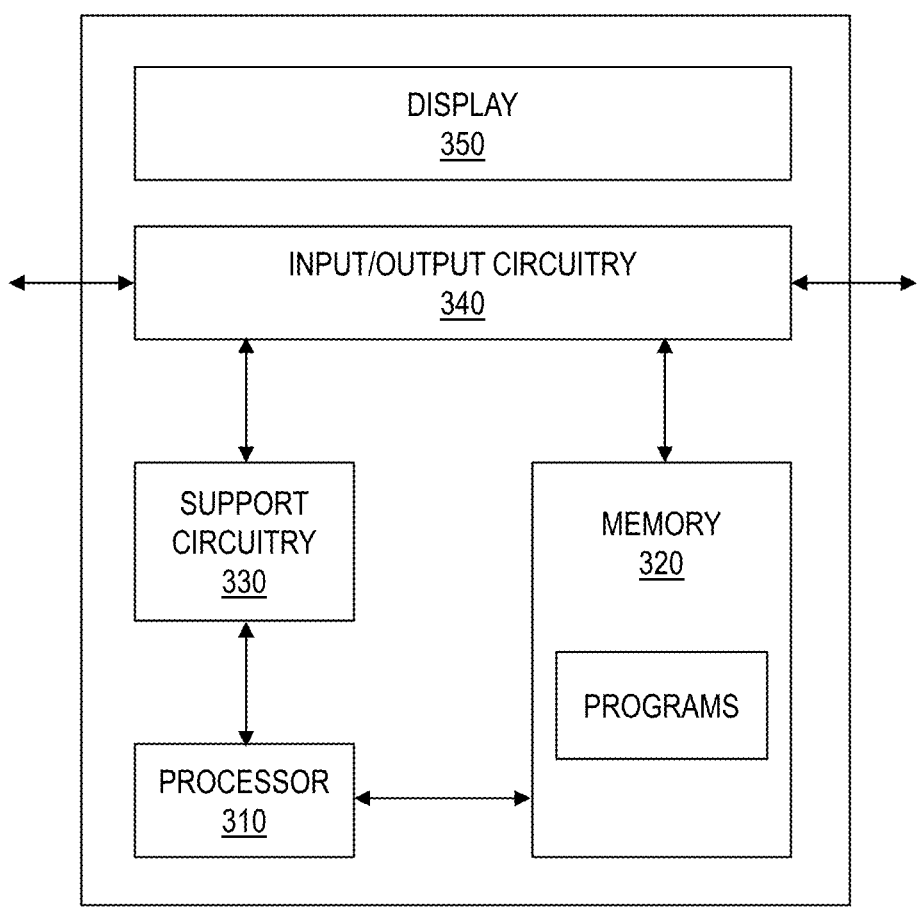
FIG. 3 illustrates a high level block diagram of a controller suitable for use in the system of FIG. 2 in accordance with one or more embodiments of the disclosure.

FIG. 3 depicts a high level block diagram of a controller 202 suitable for use in the system 200 of FIG. 2 in accordance with an embodiment of the present principles. The controller 202 of FIG. 3 comprises a processor 310 as well as a memory 320 for storing power control function types, such as functional curves, control programs, buffer pools and the like. The processor 310 cooperates with support circuitry 330 such as power supplies, clock circuits, cache memory and the like as well as circuits that assist in executing the software routines/programs stored in the memory 320. As such, some of the process steps discussed herein as software processes may be implemented within hardware, for example, as circuitry that cooperates with the processor 310 to perform various steps. The controller 202 also contains input-output circuitry 340 that forms an interface between the various functional elements communicating with the controller 202. As depicted in the embodiment of FIG. 3, the controller 202 can further include a display 350. The display 350 of the controller 202 may be used to present to a user, functional curves to be applied to power supplies affecting the deposition process, results of a deposition process having a functional curve applied in accordance with the teachings herein and the like.

Although the controller 202 of FIG. 3 is depicted as a general purpose computer, the controller 202 is programmed to perform various specialized control functions in accordance with the present principles and embodiments of the controller 202 can be implemented in hardware, for example, as an application specified integrated circuit (ASIC). As such, the process steps described herein are intended to be broadly interpreted as being equivalently performed by software, hardware, or a combination thereof.

In various embodiments of the disclosure, a substrate is processed in a suitable process chamber (such as the PVD process chamber 100 of FIG. 1). In some embodiments, the substrate is a dummy substrate used for diagnostic purposes. In some embodiments, the diagnostic is performed on a live substrate during production. The method of some embodiments comprises monitoring arcing in the process chamber. As the magnetron moves, the plasma follows the magnetron position. The plasma moves on the microsecond scale while the magnetron rotation is on the second scale. Due to the plasma transport time scope (from the top of the chamber to the wafer at the bottom of the chamber) being substantially smaller than the magnet rotation time scale, the plasma location can be considered to be the same as the magnetron location. Communication with the power supply can allow for the measurement of arcing in the millisecond time scale.

This is substantially faster than the magnetron rotation so that the measurements of the location of the arcing or other abnormal electrical signal or sensor feedback is determined with a degree of accuracy and precision that has not been previously possible.

In a broad aspect, the method of some embodiments allows for the monitoring of arcing within the process chamber due to a shorting of the energy pathlength from the target to a portion of the chamber that is not the substrate or a short of energy pathlength from any components that are next to each other inside the chamber cavity including the substrate, deposition ring, cover ring, shields, collimator and so forth (although the sensor in the power supply is routed to the target, it can sense the abnormal electric signal from the entire plasma since the plasma is continuous). Accordingly, one or more embodiments of the disclosure are directed to a method of monitoring arcing in a process chamber in which the angular and/or radial position and arcing profile are collected and analyzed. Some embodiments of the disclosure allow for the determination of the arcing position without opening the process chamber, breaking vacuum. Some embodiments of the disclosure assist in chamber troubleshooting. For example, if a consistent arcing happens in the same location, the arcing location can be correlated with components inside or outside of the chamber, so that the root cause can be identified. Being able to determine the root cause without opening the chamber to atmosphere can result in a substantial reduction in chamber down-time, ultimately decreasing the cost-of-ownership by keeping the chamber is service.

In some embodiments, the controller 202 determines positions of the magnetron 119 relative to reference locations on a surface of a substrate to be processed. In some embodiments, the position of the magnetron 119 relative to a surface of a substrate may be determined by the controller 202 using motor encoder information provided to the controller 202 by the two-axis driver 206. In some embodiments, home flags may establish a zero angular position for the magnetron with respect to a surface of a substrate being processed and may detect that angular position when the magnet passes the home flag sensor (e.g., once per revolution). In one or more embodiments, information regarding positions of the magnetron relative to reference locations on the surface of a substrate may be retrieved from a memory 320 of the controller 202, having been previously determined and stored in the memory 320 of the controller 202.

Figure 4:
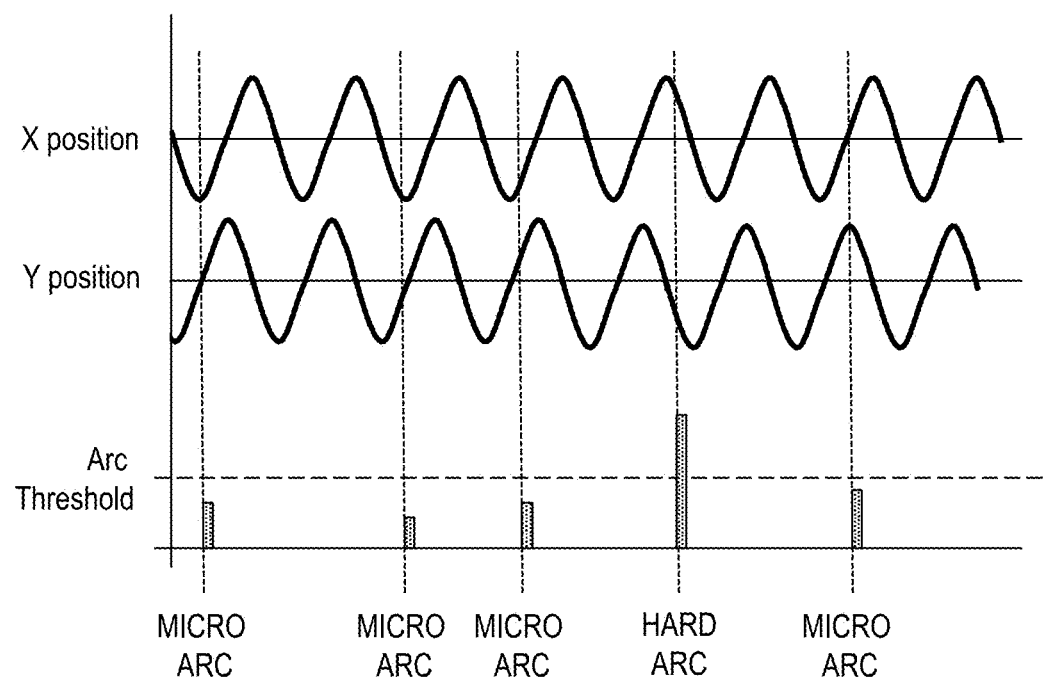
FIG. 4 illustrates a graphical representation of a method of monitoring arcing in a processing chamber including positional coordinates and arcing states.

FIG. 4 illustrates a graph of the position and arcing monitoring according to one or more embodiments of the disclosure. The angular position of a magnetron in the process chamber is determined relative to a reference location on the surface of the substrate using positional information of a motor used to position the magnetron. The graphic shows the X position and Y position as the magnetron moves. Arcing is measured within the chamber and correlated to the X and Y positions. For example, in some embodiments, a table of positional data and arcing states is collected which can then be analyzed to generate an arcing profile.

The arcing profile provides the arcing state measured based at least on the determined angular position of the magnetron. In some embodiments, the plurality of arcing states comprises a NO ARC state, a MICRO ARC state and a HARD ARC state. The NO ARC state is indicated by a baseline measurement from a sensor configured to measure the existence of an arc discharge. For example, a V-I sensor in the plasma power source, or adjacent to and in electrical communication with the power source. When arcing occurs, the V-I sensor would measure a change in the power, current or voltage provided to generate the plasma relative to a baseline measurement. Electrical changes that can be monitored to indicate a change in the plasma provided to generate the plasma include, but are not limited to, a change in the electrical resistance, current, voltage, impedance, etc.

The MICRO ARC state is indicated by a change in the power provided to the plasma that is below a predetermined arc threshold value. Micro-arcs can occur as the magnetron moves for any number of reasons. Micro-arcs are of sufficiently small magnitude so that damage to the chamber or substrate is within an acceptable level. The HARD ARC state is indicated by a change in the power or current provided to the plasma that is above a predetermined threshold value. Hard arcs are of sufficient magnitude so as to present a potential hazard to the process chamber of the substrate. The predetermined threshold value can be the upper bound of the MICRO ART state, or can be the lower bound of the HARD ARC state. The graphic illustrated in FIG. 4 shows the Arc Threshold with four instances of MICRO ARCS and one instance of a HARD ARC.

Figure 5:
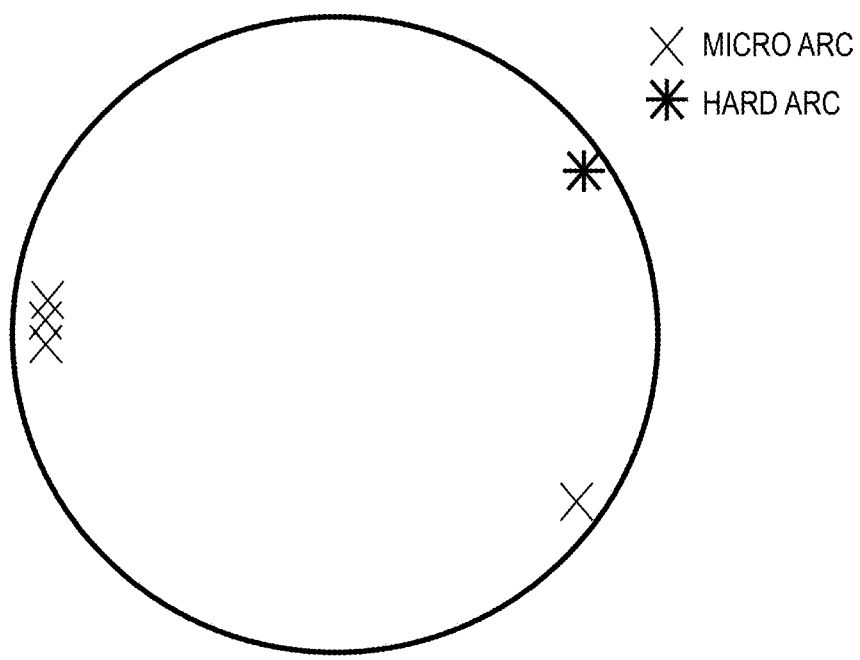
FIG. 5 illustrates a schematic representation of a substrate with the locations of the arcing states based on the graphical representation of the method of FIG. 4.

FIG. 5 shows an arcing map of a substrate or process chamber based on the arcing profile collected during the method. The embodiment illustrated in FIG. 5 is indicative of the data that may be collected in a process similar to that illustrated in FIG. 4. The arcing map shows the location of the four MICRO ARC states and the one HARD ARC state as positions on the substrate or target within the chamber. In the embodiment illustrated in FIG. 5, all of the arc states are measured at the same radial distance for the magnetron. In some embodiments, the radial distance of the magnetron is variable, and the arcing (or other electrical abnormalities) are measured at the relative radial locations.

The number of measurements can be controlled to provide sufficient angular and arcing resolution to measure monitor the process chamber. In some embodiments, measurement of the arcing state occurs less than every 10 milliseconds, 5 milliseconds, 2 milliseconds, 1 millisecond or 0.5 milliseconds.

In some embodiments, the method further comprises stopping the process occurring in the process chamber is a predetermined event occurs. In some embodiments, the process chamber is stopped if a HARD ARC has an arc magnitude that is above a predetermined arc magnitude stop threshold. In some embodiments, the process chamber is stopped if the number of HARD ARC states measured exceeds a predetermined numerical stop threshold.

Figure 6A:
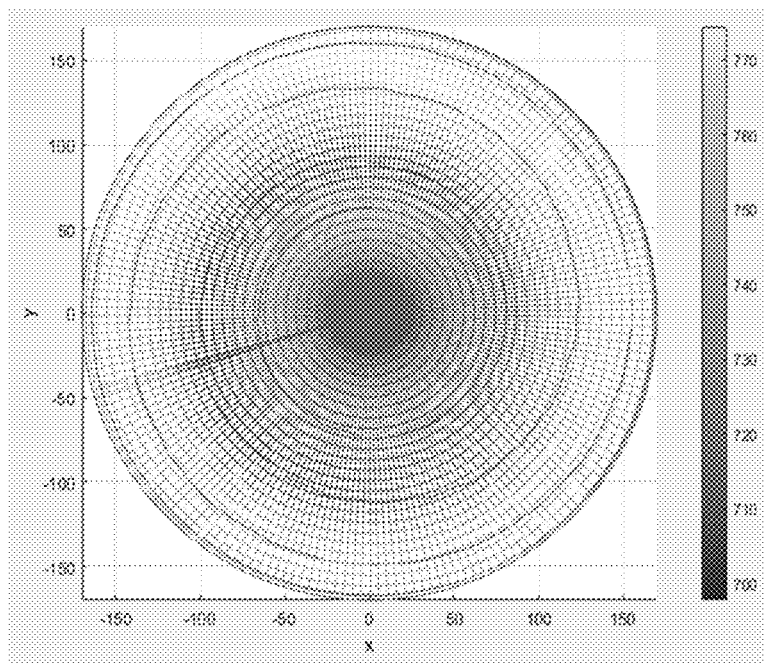
FIG. 6A illustrates a 2D contour plot of the target voltage measurement from a VI sensor as a function of the X and Y position of the magnetron according to one or more embodiments of the disclosure.
Figure 6B:
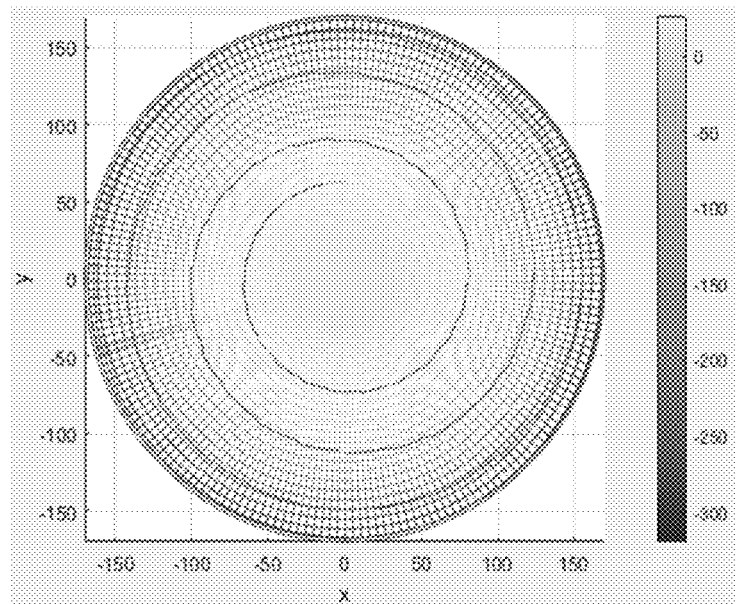
FIG. 6B illustrates a 2D contour plot of the wafer bias as might be measured from a wafer chucking power supply as a function of the X and Y position of the magnetron according to one or more embodiments of the disclosure.
Figure 6C:
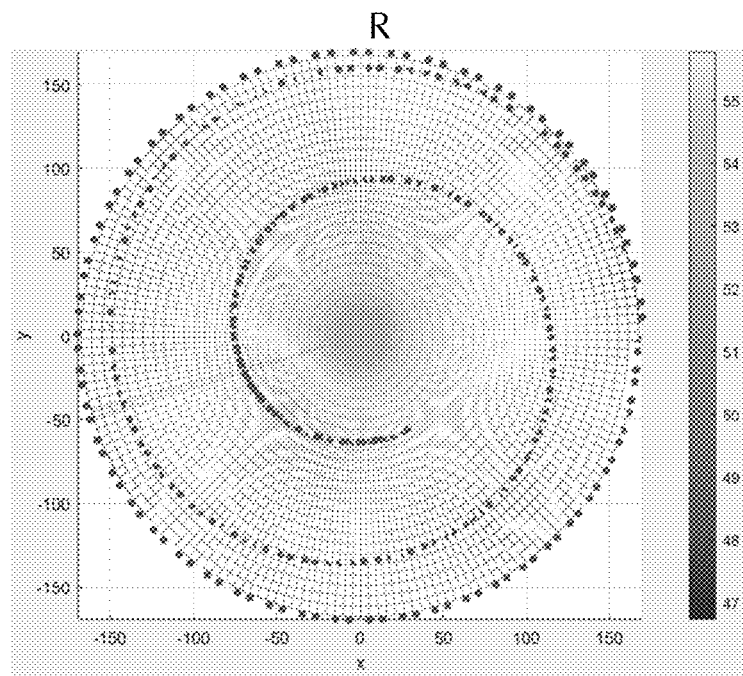
FIGS. 6C and 6D illustrate 2D contour plots of the real (R) and imaginary (X) components, respectively, of the radio frequency (RF) impedance a match circuit between the power supply and the plasma as a function of the X and Y position of the magnetron according to one or more embodiments of the disclosure.
Figure 6D:
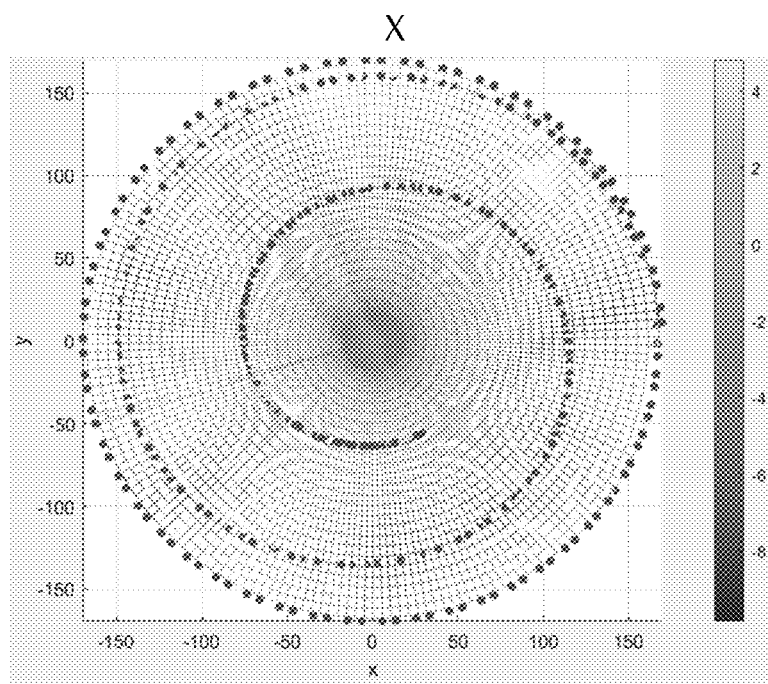

While the previous embodiments have been described with respect to plasma arcing, the skilled artisan will recognize that other electrical parameters and abnormalities can be monitored. For example, other electrical signal changes as a function of the magnetron position can capture the abnormality of the plasma at specific locations. Suitable sensor readings include, but are not limited to, readings for wafer potential (e.g., from a sensor in electrostatic chuck power supply), impedance (e.g., from a sensor in the RF match circuit), collimator current or power (e.g., from a sensor in the collimator power supply output voltage control). FIGS. 6A through 6D illustrate non-limiting examples of electrical parameters that can be monitored. FIG. 6A illustrates a 2D contour plot of the target voltage measurement from a VI sensor as a function of the X and Y position of the magnetron (shown as the dark path spiraling inward). FIG. 6B illustrates a 2D contour plot of the wafer bias as might be measured from a wafer chucking power supply as a function of the X and Y position of the magnetron. FIGS. 6C and 6D illustrate 2D contour plots of the real (R) and imaginary (X) components, respectively, of the RF impedance a match circuit between the power supply and the plasma as a function of the X and Y position of the magnetron. Additional embodiments of the disclosure are directed to apparatus for monitoring arcing within a process chamber including a moveable magnetron and at least one power supply. The apparatus of some embodiments comprises a process and a memory coupled thereto that has executable instructions to configure the apparatus to perform the monitoring process as described herein. Further embodiments of the disclosure are directed to substrate processing systems comprising a processing chamber as described herein with a substrate support, target, a movable magnetron, at least one power supply and a controller. The controller, as described herein, includes instructions to perform the monitoring process as described herein.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure includes modifications and variations that are within the scope of the appended claims and their equivalents.

What is claimed is:

1. A method of monitoring arcing in a process chamber, the method comprising:
   determining at least an angular position of a magnetron in the process chamber relative to a reference location on a surface of a substrate using positional information of a motor used to position the magnetron; and
   generating an arcing profile comprising a plurality of arcing states measured based at least on the determined angular position of the magnetron.

2. The method of claim 1, wherein the plurality of arcing states comprises a NO ARC state in which there is no arcing measured, a MICRO ARC state in which an arc magnitude is measured below a predetermined arc threshold, and a HARD ARC state in which an arc magnitude is measured greater than the predetermined arc threshold.

3. The method of claim 2, further comprising stopping the method if a HARD ARC has an arc magnitude above a predetermined arc magnitude threshold, or a number of HARD ARCs exceeds a predetermined stop threshold.

4. The method of claim 2, wherein measuring the plurality of arcing states comprises a V-I sensor operating at a frequency less than 50 msec.

5. The method of claim 2, further comprising generating an arcing map based on the arcing profile, the arcing map indicating locations of MICRO ARC states and HARD ARC states relative to the determined angular position of the magnetron.

6. The method of claim 1, wherein determining at least the angular position comprises determining an angular position of the magnetron relative to a central axis of or the reference location on the surface of the substrate.

7. An apparatus for monitoring arcing within a process chamber including a moveable magnetron and at least one power supply, the apparatus comprising:
   a processor; and
   a memory coupled to the processor, the memory having stored therein instructions executable by the processor to configure the apparatus to:
   determine at least an angular position of a magnetron in the process chamber relative to a reference location on a surface of a substrate using positional information of a motor used to position the magnetron; and
   generate an arcing profile comprising a plurality of arcing states measured based at least on the determined angular position of the magnetron.

8. The apparatus of claim 7, wherein the at least one power supply comprises a direct current (DC) source, a radio frequency (RF) source.

9. The apparatus of claim 8, wherein the plurality of arcing states comprises a NO ARC state in which there is no arcing measured, a MICRO ARC state in which an arc magnitude is measured below a predetermined arc threshold, and a HARD ARC state in which an arc magnitude is measured greater than the predetermined arc threshold.

10. The apparatus of claim 9, wherein the processor is further configured to stop the apparatus if a HARD ARC has an arc magnitude above a predetermined arc magnitude threshold, or a number of HARD ARCs exceeds a predetermined stop threshold.

11. The apparatus of claim 9, wherein measuring the plurality of arcing states comprises a V-I sensor operating at a frequency less than 50 msec.

12. The apparatus of claim 11, wherein the V-I sensor is within the at least one power supply.

13. The apparatus of claim 9, wherein the processor is further configured to generate an arcing map based on the arcing profile, the arcing map indicating locations of MICRO ARC states and HARD ARC states relative to the determined angular position of the magnetron.

14. The apparatus of claim 9, wherein the angular position of the magnetron is determined relative to the reference location on the surface of the substrate using a motor encoder information provided to the processor by a two-axis driver.

15. The apparatus of claim 9, wherein the process chamber comprises a two-axis driver for controlling a movement of the magnetron and communicating position information of the magnetron to the apparatus, and the apparatus generates the arcing profile comprising the plurality of arcing states as a function of the position information of the magnetron.

16. A substrate processing system comprising:
   a process chamber, comprising;
      an inner volume;
      a substrate support disposed within the inner volume to support a substrate;
      a movable magnetron configured to be disposed proximate a back side of a target opposite a front face of the target and rotatable about a central axis of the substrate support; and
      at least one power supply providing power to the process chamber; and
      a controller comprising a processor and a memory coupled to the processor, the memory having stored therein instructions executable by the processor to configure the controller to:
   determine at least an angular position of the movable magnetron in the process chamber relative to a reference location on a surface of the substrate using positional information of a motor used to position the magnetron; and
   generate an arcing profile comprising a plurality of arcing states measured based at least on the determined angular position of the magnetron.

17. The substrate processing system of claim 16, wherein the plurality of arcing states comprises a NO ARC state in which there is no arcing measured, a MICRO ARC state in which an arc magnitude is measured below a predetermined arc threshold, and a HARD ARC state in which an arc magnitude is measured greater than the predetermined arc threshold.

18. The substrate processing system of claim 17, wherein the controller is further configured to stop the substrate processing system if a HARD ARC has an arc magnitude above a predetermined arc magnitude threshold, or a number of HARD ARCs exceeds a predetermined stop threshold.

19. The substrate processing system of claim 17, wherein measuring the plurality of arcing states comprises a V-I sensor operating at a frequency less than 10 msec.

20. The substrate processing system of claim 17, further comprising generating an arcing map based on the arcing profile, the arcing map indicating a location of MICRO ARC states and HARD ARC states relative to the determined angular position of the magnetron.

* * * * *